United States Patent [19]
Iwamoto et al.

[11] Patent Number: 5,066,340
[45] Date of Patent: Nov. 19, 1991

[54] PHOTOVOLTAIC DEVICE

[75] Inventors: Masayuki Iwamoto, Hyogo; Kouji Minami; Toshihiko Yamaoki, both of Osaka, all of Japan

[73] Assignee: Sanyo Electric Co., Ltd., Moriguchi, Japan

[21] Appl. No.: 563,567

[22] Filed: Aug. 6, 1990

[30] Foreign Application Priority Data

Aug. 9, 1989 [JP] Japan .................................. 1-206143

[51] Int. Cl.$^5$ ............... H01L 31/075; H01L 31/0368; H01L 31/0376
[52] U.S. Cl. ...................................... 136/258; 357/30
[58] Field of Search ................ 136/258 PC, 258 AM, 136/261; 357/30 J, 30 K

[56]  References Cited

U.S. PATENT DOCUMENTS

| | | | |
|---|---|---|---|
| 4,016,586 | 4/1977 | Anderson et al. | 357/2 |
| 4,434,318 | 2/1984 | Gibbons | 136/258 |
| 4,496,788 | 1/1985 | Hamakawa et al. | 136/249 |

FOREIGN PATENT DOCUMENTS 62-128572 6/1987 Japan ........................... 136/258 PC

OTHER PUBLICATIONS

W. Fuhs, "Heterojunctions of Amorphous Silicon and Silicon Single Crystals", Int. Conf. on Tetrahedrally Bonded Amorphous Semiconductors, Yorktown Heights, N.Y., Mar. 1974, pp. 345–350.
H. Matsuura et al, *J. Appl. Phys.*, vol. 55, No. 4, Feb. 1984, pp. 1012–1019.

*Primary Examiner*—Aaron Weisstuch
*Attorney, Agent, or Firm*—W. G. Fasse; D. H. Kane, Jr.

[57]    ABSTRACT

A photovoltaic device has a crystalline layer of a first conductivity type formed of crystalline silicon semiconductor material, an amorphous layer of an opposite conductivity type formed of amorphous silicon semiconductor material, and a microcrystalline layer formed of substantially intrinsic microcrystalline silicon semiconductor material provided between the crystalline layer and the amorphous layer.

5 Claims, 2 Drawing Sheets

PHOTOVOLTAIC DEVICE

FIELD OF THE INVENTION

The present invention relates to a photovoltaic device provided with a crystalline silicon semiconductor layer and an amorphous silicon semiconductor layer.

BACKGROUND INFORMATION

A heterojunction type photovoltaic device in which an amorphous silicon layer is stacked on a single crystalline or polycrystalline silicon substrate is disclosed in U.S. Pat. No. 4,496,788. This heterojunction type photovoltaic device has a low-cost advantage as compared to a photovoltaic device in which both of an n type layer and a p type layer are composed of single crystals, since its p-type layer and n type layer are formed of an amorphous silicon layer, which allows a low a temperature process to be employed. Furthermore, this heterojunction type photovoltaic device has an advantage that its conversion efficiency is high as compared to an amorphous photovoltaic device in which amorphous layers form a pin junction. Accordingly, such a heterojunction type photovoltaic device is in the spotlight as a low-cost photovoltaic device having an excellent conversion efficiency.

However, in a heterojunction type photovoltaic device in which an amorphous silicon layer is stacked on a silicon crystal, there has been a problem that a large number of interface states are produced between the crystalline layer and the amorphous layer so that a high conversion efficiency could not be obtained because of a recombination of carriers.

Also, there has been a problem that a considerable difference between the crystalline silicon band gap and the amorphous silicon band gap, produces a large barrier in the vicinity of the interface, so that transportation of the photoexcited carriers is prevented by this barrier, which does not allow a sufficient output of the photocurrent.

Furthermore, there also has been a problem that a large number of dangling-bonds exist in the vicinity of these interfaces because of lattice mismatch of the crystalline silicon and the amorphous silicon, whereby interface states are increased, resulting in an increase in the recombination of the carriers.

To sum up, in a conventional heterojunction solar battery in which an amorphous silicon semiconductor is stacked on a crystalline silicon semiconductor, there have been the problems that photo current could not be outputted sufficiently and the conversion efficiency was not satisfactory due to the large difference between band gaps and due to the lattice mismatch.

SUMMARY OF THE INVENTION

It is an object of the present invention to provide a heterojunction type photovoltaic device which has a higher conversion efficiency than a conventional device, and besides, can be manufactured economically.

The photovoltaic device according to the present invention includes a crystalline layer of a first conductivity type formed of crystalline silicon semiconductor, an amorphous layer of an opposite conductivity type formed of an amorphous silicon semiconductor, and a microcrystalline layer formed of a substantially intrinsic microcrystalline silicon semiconductor provided between the crystalline layer and the amorphous layer.

In a preferred embodiment according to the present invention, the thickness of the crystalline layer is 1–500 $\mu$m, and the thickness of the amorphous layer is 20–5000Å. In this embodiment, the thickness of the microcrystalline layer is preferably not more than 500Å.

The thickness of the amorphous layer is preferably made as thin as possible, and it is 20–300Å, for example.

The diameter of silicon crystals in the microcrystalline layer is not particularly limited in the present invention, but preferably it is 10–1000Å.

According to the present invention, a microcrystalline layer formed of substantially intrinsic microcrystalline silicon semiconductor is provided between a crystalline layer and an amorphous layer. The band gap of this microcrystalline layer is of an almost intermediate value between those of the amorphous layer and the crystalline layer. Thus, a barrier produced in the vicinity of the interface due to a large difference in band the gap, is lowered which facilitates the transportation of the photoexcited carriers around the interface, resulting in a restraining of the recombination.

Furthermore, as the microcrystal layer is substantially intrinsic, the interface state density becomes lower so that the recombination of the carriers is restrained as mentioned.

Another advantage is seen in that the microcrystalline layer, it reduces lattice mismatch between the crystalline layer and the amorphous layer.

The microcrystalline layer of the present invention is an intrinsic type layer not containing a conductivity type determining impurity,, such as boron or phosphorus, or alternatively, is a lightly doped layer containing just a small amount of the same. In the present invention, such a layer is referred to as a substantially intrinsic layer.

In the photovoltaic device according to the present invention, the photovoltaic characteristics have been improved so that a better photoelectric conversion efficiency is achieved by providing a microcrystalline layer between the amorphous layer and the crystalline layer resulting in improved junction characteristics as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
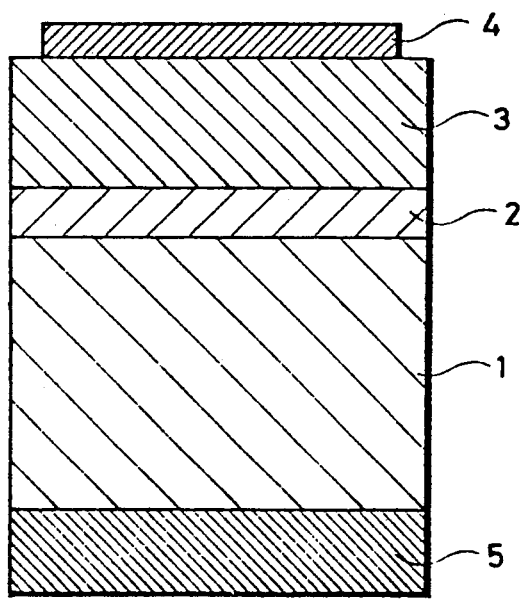
FIG. 1 is a sectional view schematically showing one embodiment of the present invention.

Referring to FIG. 1, a microcrystalline layer 2 is provided on a p-type crystalline layer 1 composed of a single crystalline or polycrystalline, silicon semiconductor. The microcrystalline layer 2 is a microcrystalline layer formed of a substantially intrinsic microcrystalline silicon semiconductor. The thickness of the microcrystalline layer is 200Å in this Example. The diameters of the silicon crystal in the microcrystalline layer 2 is about 100Å.

An n type amorphous layer 3 formed of amorphous silicon semiconductor is provided on the microcrystalline layer 2. A front electrode formed of a transparent conductive oxide is provided on the amorphous layer 3. As the transparent conductive oxide, $SnO_2$, ITO, and ZnO may be employed. A back electrode 5 formed of ohmic metal is provided on the back of the crystalline layer 1. The crystalline layer 1, the microcrystalline layer 2, and the amorphous layer 3 are sandwiched between the back electrode 5 and the front electrode 4.

In this Example, the thickness of the crystalline layer 1 is 400 $\mu$m and the thickness of the amorphous layer 3 is 100Å.

In this Example, in order to examine the effects of the film thickness of the microcrystalline layer 2 on the conversion efficiency, photovoltaic devices having varied film thicknesses of 100Å, 500Å and 600Å, respectively, were manufactured and the conversion efficiencies thereof measured.

Figure 2:
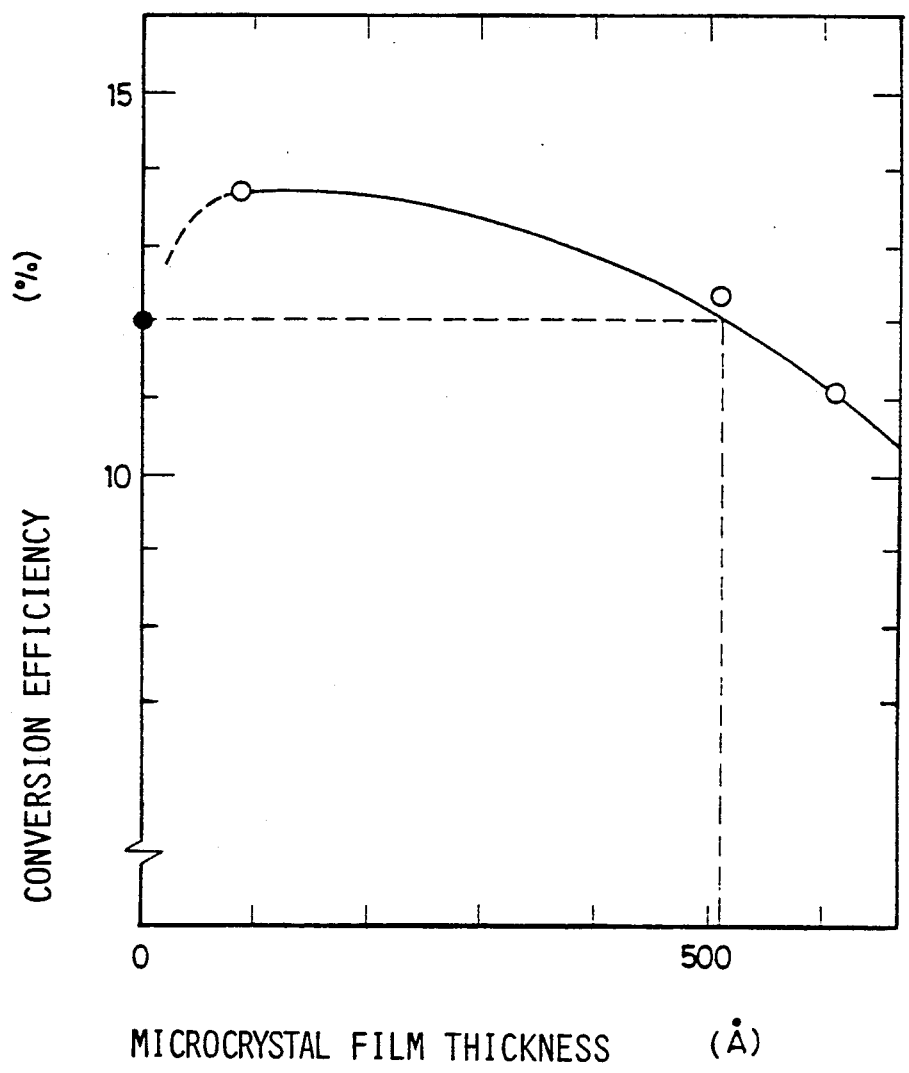
FIG. 2 is a diagram showing the relationship between the thickness of the microcrystalline layer and the conversion efficiency in the embodiment according to the present invention.

FIG. 2 is a diagram showing the relationship between thickness of the microcrystalline layer and the conversion efficiency. In FIG. 2, the conversion efficiency at the point where the film thickness of the microcrystalline layer is 0 indicates a conversion efficiency in a conventional photovoltaic device having no microcrystalline layer. As shown in FIG. 2, it is understood that a conversion efficiency higher than that of a conventional photovoltaic device is obtained when the film thickness of the microcrystalline layer is not more than 500Å. Accordingly, the microcrystalline layer 2 is preferably not more than 500Å. Furthermore, as a result of examining the effects of the microcrystalline layer thickness on the conversion efficiency under the conditions of varied thicknesses of the crystalline and amorphous layers, it was confirmed that the thickness of the microcrystalline layer is preferably not more than 500Å in the ranges of crystalline layer thickness of 1 $\mu$m–500 $\mu$m and an amorphous layer thickness of 200–5000Å.

In the photovoltaic device according to the present invention, a microcrystalline layer 2 and an n-type or p-type amorphous layer 3 may be formed by the plasma CVD method using $SiH_4$ gas as the main raw material gas on a p type or n-type crystalline layer 1 as a substrate. As for the microcrystalline layer 2, for example, a microcrystalline layer 2 having polysilicon crystals of a diameter in the range of 100–1000Å may be obtained under the conditions of a gas composition ratio of $SiH_4/H_2 = 0.05$ and at a substrate temperature of 180°–400° C. A p-type amorphous layer may be obtained under the conditions of a gas composition ratio of $B_2H_6/SiH_4 = 0.01–0.05$ and at a substrate temperature of 180° C. An n-type amorphous layer is obtained under the conditions of gas composition ratio of $PH_3/SiH_4 = 0.001–0.05$ and at a substrate temperature of 200° C.

When the crystalline layer according to the invention is a p-type layer, the amorphous layer is of the n-type, and when the crystalline layer is of the n-type, the amorphous layer is of p-type.

A microcrystalline layer having a thickness of 200Å and an optical band gap of 1.4–1.5 eV was formed under the above-described conditions on a crystalline layer with a thickness of 400 $\mu$m and an optical band gap of 1.12 eV. An amorphous layer having a thickness of 2000Å and an optical band gap of 1.6–1.8 eV, was stacked on this microcrystalline layer to form a photovoltaic device with an effective area of 1 $cm^2$ The photovoltaic device characteristics such as the open-circuit voltage $V_{oc}$, the short-circuit current $I_{sc}$, the fill factor (F.F.) and the conversion efficiency $\eta$ were measured while exposing the device to a light irradiation of AM-1.5, 100 $mW/cm^2$. The measurement results are shown in Table 1.

For comparison, a photovoltaic device was produced in which a microcrystalline layer is not provided between a crystalline layer and an amorphous layer but an amorphous layer was formed directly on a crystalline layer In this reference example, the thickness of the amorphous layer was 2200Å. The photovoltaic device characteristics of this reference example were also measured under the same conditions and the results are shown in Table 1.

TABLE 1

|  | $V_{oc}$ (V) | $I_{sc}$ ($mA/cm^2$) | F.F. | $\eta$ (%) |
|---|---|---|---|---|
| Example | 0.55 | 21.8 | 0.72 | 8.63 |
| Reference Example | 0.50 | 16.7 | 0.68 | 5.68 |

As clearly seen from Table 1, the photovoltaic device according to the present invention shows excellent characteristics as compared to the reference example. Especially, it shows a considerably higher value in conversion efficiency.

As for the obtained results, it is believed that not only the interface state density but also the barrier height at the interface were reduced by providing a microcrystalline layer between a crystalline layer and an amorphous layer.

In the above-described Example, the microcrystalline layer is formed by the plasma CVD method. However, the microcrystalline layer may be formed, for example, by the thermal CVD method with a substrate temperature of 500°–700° C. and using $SiH_4$ gas as the main raw material gas.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising a crystalline layer of a first conductivity type formed of crystalline silicon semiconductor material; an amorphous layer of the opposite conductivity type formed of amorphous silicon semiconductor material, and a microcrystalline layer composed of substantially intrinsic microcrystalline silicon semiconductor material, provided between said crystalline layer and said amorphous layer.

2. The photovoltaic device according to claim 1, wherein the thickness of said crystalline layer is within the range of 1–500 $\mu$m, and the thickness of said amorphous layer is within the range of 20–5000Å.

3. The photovoltaic device according to claim 2, wherein the thickness of said microcrystalline layer is not more than 500Å.

4. The photovoltaic device according to claim 2, wherein the thickness of said amorphous layer is within the range of 20–300Å.

5. The photovoltaic device according to claim 1, wherein the diameter of silicon crystals of said crystals of said microcrystalline layer is in the range of 10–1000Å.

* * * * *

UNITED STATES PATENT AND TRADEMARK OFFICE
CERTIFICATE OF CORRECTION

PATENT NO.   : 5,066,340
DATED        : November 19, 1991
INVENTOR(S)  : Masayuki Iwamoto, Kouji Minami, Toshihiko Yamaoki It is certified that error appears in the above-identified patent and that said Letters Patent is hereby corrected as shown below:

Claim 5, (Column 4, line 65), delete "of said crystals".

Signed and Sealed this

Twentieth Day of April, 1993

Attest:

MICHAEL K. KIRK

Attesting Officer

Acting Commissioner of Patents and Trademarks